(12) United States Patent
Hsu et al.

(10) Patent No.: US 6,628,143 B2
(45) Date of Patent: Sep. 30, 2003

(54) FULL-SWING SOURCE-FOLLOWER LEAKAGE TOLERANT DYNAMIC LOGIC

(75) Inventors: Steven K. Hsu, Lake Oswego, OR (US); Mark A. Anders, Hillsboro, OR (US); Sanu K. Mathew, Hillsboro, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/965,360

(22) Filed: Sep. 26, 2001

(65) Prior Publication Data

US 2003/0058000 A1 Mar. 27, 2003

(51) Int. Cl.$^7$ .................. H03K 19/096; H03K 19/20
(52) U.S. Cl. .................. 326/95; 326/98; 326/121
(58) Field of Search .................. 326/93, 95, 98, 326/83, 27, 28, 121

(56) References Cited

U.S. PATENT DOCUMENTS 5,821,778 A * 10/1998 Bosshart .................. 326/95
6,204,696 B1 * 3/2001 Krishnamurthy et al. ..... 326/98

FOREIGN PATENT DOCUMENTS

KR   2001047544 A  *  6/2001

* cited by examiner

Primary Examiner—Daniel Chang
(74) Attorney, Agent, or Firm—Seth Z. Kalson

(57) ABSTRACT

An embodiment of a full-swing, source-follower leakage tolerant dynamic logic gate comprises an nMOSFET logic to conditionally charge a node during an evaluation phase, and to charge the node to a relatively small voltage during the pre-charge phase so that the nMOSFET logic becomes reverse-biased.

4 Claims, 3 Drawing Sheets

FULL-SWING SOURCE-FOLLOWER LEAKAGE TOLERANT DYNAMIC LOGIC

FIELD

Embodiments of the present invention relate to digital circuits, and more specifically, to dynamic logic circuits.

BACKGROUND

Sub-threshold leakage currents in dynamic circuits may limit performance as process technology leads to smaller and smaller device size. To maintain circuit robustness, designers have used various approaches, but with the result that circuit delay and performance may be adversely affected. These issues are discussed in more detail by considering the prior art domino logic in FIG. 1.

The domino logic gate in FIG. 1 comprises dynamic stage 102 and static stage 104. In the particular example of FIG. 1, static stage 104 is a single-input, single-output inverter, but other inverting static logic may be employed. nMOS (Metal Oxide Semiconductor) logic 108 comprises one or more nMOSFETs (Metal Oxide Semiconductor Field Effect Transistor) to conditionally pull node 110 LOW during an evaluation phase, depending upon the input voltages at input ports 106. (Input ports 106 may actually consist of only one input port, e.g., if the domino gate is an inverter gate.)

During an evaluation phase, clock signal $\phi$ is HIGH so that pMOSFET 112 is OFF and nMOSFET 114 is ON to conditionally provide a low impedance path between node 110 and ground 128 at voltage $V_{SS}$ depending upon the input voltages at input ports 106. During a pre-charge phase, clock signal $\phi$ is LOW so that nMOSFET 114 is OFF and pMOSFET 112 is ON to pull node 110 HIGH by providing a low impedance path between node 110 and power rail 126 at supply voltage $V_{CC}$.

If the domino gate of FIG. 1 is not at a clock boundary, then nMOSFET 114 may be removed so that nMOS logic 108 is connected directly to ground 128 if all input voltages are LOW during an evaluation phase. This is the reason for illustrating nMOSFET 114 with dashed lines. A half-keeper comprising inverter 116 and pMOSFET 118 is designed to maintain node 110 HIGH unless it is otherwise pulled LOW by nMOS logic 108 during an evaluation phase. Only one domino gate is shown in FIG. 1, but in practice, a plurality of such gates are connected together to form a larger domino circuit. For example, output port 124 of the domino logic gate may be connected to an input port of another domino logic gate.

Sub-threshold leakage current in an nMOSFET comprises source-drain current when the gate-to-source voltage $V_{GS}$ is less than the threshold voltage $V_T$. Consider the circuit of FIG. 1 during an evaluation phase in which the input voltages at input ports 106 are such that nMOS logic 108 does not pull node 110 LOW. (That is, the input voltages are such that the output logic voltage at output port 124 of the domino logic gate is supposed to be LOW.) Unless the circuit of FIG. 1 is designed properly, sub-threshold leakage current through nMOS logic 108 during the evaluation stage may prevent the half-keeper from maintaining node 110 sufficiently HIGH, so that output port 124 may provide an incorrect logic level. One approach to mitigate this effect is to size the half-keeper larger so as to maintain acceptable robustness. However, a larger half-keeper may cause evaluation contention with nMOS logic 108 during an evaluation phase if nMOS logic 108 tries to pull node 110 LOW, which may increase the delay of the domino gate. Another approach is to employ high-$V_T$ (high-threshold-voltage) nMOSFETs in MOS logic 108 to reduce the amount of sub-threshold leakage current. However, using high-$V_T$ nMOSFETs in MOS logic 108 may increase the delay in the domino gate.

DESCRIPTION OF EMBODIMENTS

Figure 2:
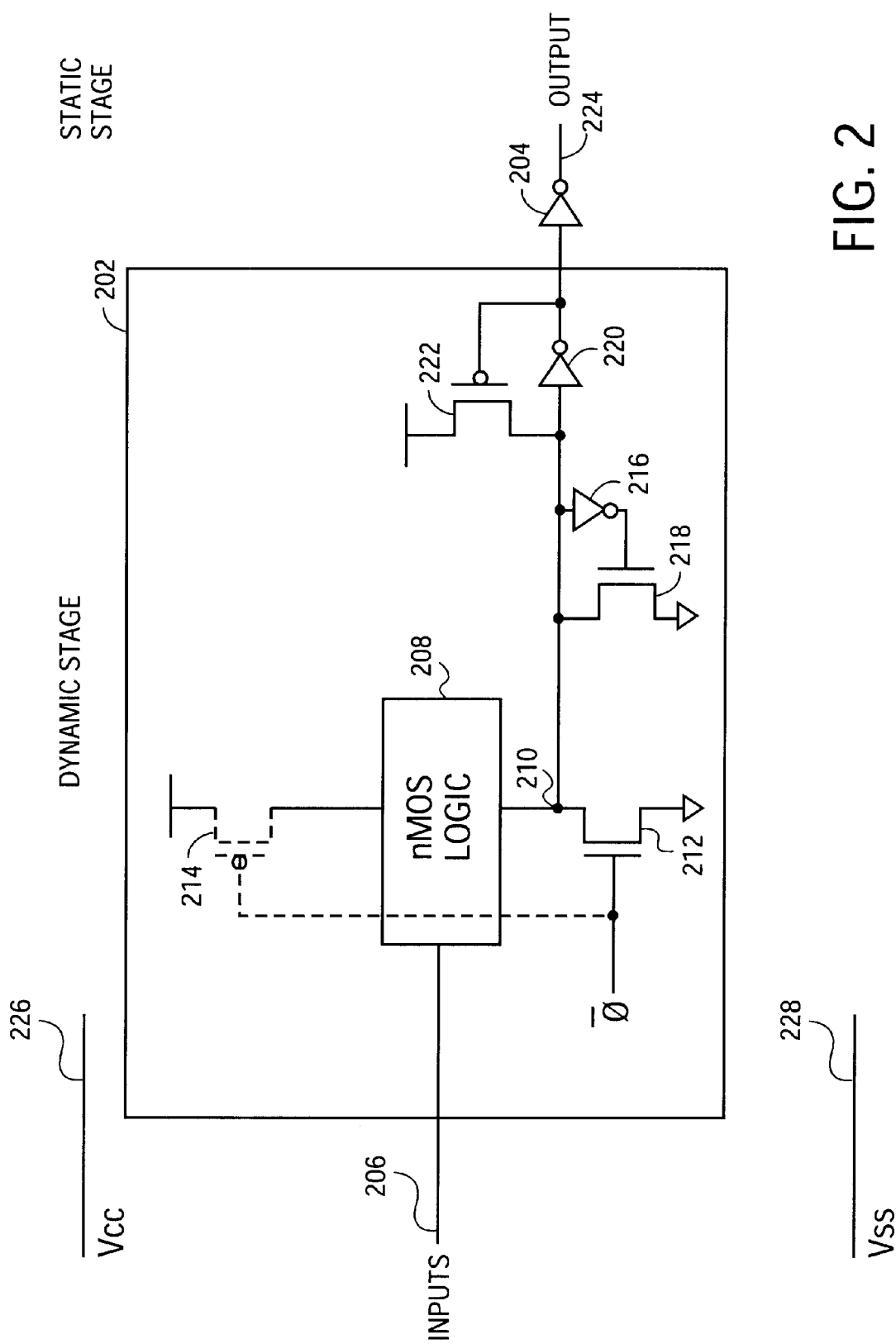
FIG. 2 is an embodiment domino logic gate according to an embodiment of the present invention.

FIG. 2 is a circuit for a domino logic gate according to an embodiment of the present invention. The domino gate of FIG. 2 is in it pre-charge phase when $\bar{\phi}$ is HIGH and is in its evaluation phase when $\bar{\phi}$ is LOW. The domino logic gate comprises dynamic stage 202 and static stage 204. In the particular embodiment of FIG. 2, static stage 204 is a single-input, single-output inverter, but other inverting static logic may be employed.

nMOS logic 208 comprises one or more nMOSFETs that conditionally switch ON to charge node 210 during an evaluation phase, depending upon the input voltages at input ports 206. (Input ports 206 may actually consist of one input port, e.g., if the domino logic gate is an inverter gate.) During an evaluation phase, clock signal $\bar{\phi}$ is LOW so that nMOSFET 212 is OFF and pMOSFET 214 is ON so that a low impedance path is conditionally provided between node 210 and power rail 226, depending upon the input voltages at input ports 206. Power rail 226 is at a supply voltage $V_{CC}$. During a pre-charge phase, clock signal $\bar{\phi}$ is HIGH so that pMOSFET 214 is OFF and nMOSFET 212 is ON to discharge node 210 by providing a low impedance path between node 210 and ground 228 at voltage $V_{SS}$.

Note that we have referred to the condition in which the clock signal $\bar{\phi}$ is HIGH as a pre-charge phase, even though node 210 is actually being discharged by nMOSFET 212 during a pre-charge phase. Consequently, one may refer to this condition as a pre-discharge phase instead of a pre-charge phase. It is to be understood in these letters patent that these terms may be used interchangeably, and that for simplicity the term pre-charge phase will be used here even though for the embodiments of the present invention described herein a node is being discharged when the dynamic circuit enters its pre-charge phase.

If the domino gate of FIG. 2 is not at a clock boundary, then the input voltages are LOW during a pre-charge phase, and consequently pMOSFET 214 may be removed so that nMOS logic 208 is connected directly to power rail 226. This is the reason for illustrating pMOSFET 214 with dashed lines.

Inverter 216 and nMOSFET 218 comprise a half-keeper. The combination of inverter 220 and pMOSFET 222 will be referred to as a single-ended sense amplifier. Their roles will be discussed further when considering the operation of the embodiment domino logic gate of FIG. 2, which is now described.

Consider the pre-charge (pre-discharge) phase in which the clock signal $\bar{\phi}$ is HIGH, pMOSFET 214 is OFF (if present, such as for a domino stage on a clock boundary), nMOSFET 212 is ON, and the input voltages are LOW (if not on a clock boundary). nMOSFET 212 will turn ON and will discharge node 210. For example, for some embodiments, nMOSFET 212 may be sized large enough so that node 210 is brought LOW ($V_{SS}$). Node 210 is discharged to a low enough voltage so that the combination of inverters 220 and 204 provide a LOW output voltage at output port 224. In this way, other domino gates connected to output port 224 are not affected when in a pre-charge phase.

Now consider the evaluation phase in which the clock signal $\bar{\phi}$ is LOW, pMOSFET 214 is ON (if present), and nMOSFET 212 is OFF. Suppose the input voltages at input ports 206 are such that there is no nMOSFET stack within nMOS logic 208 that is switched ON. If node 210 was pulled LOW during the pre-charge phase, then sub-threshold leakage current through nMOS logic 208 will charge node 210 to some voltage dV above $V_{SS}$ until the one or more nMOSFETs within nMOS logic 208 with sources connected to node 210 are reverse-biased into their cutoff region and are strongly turned OFF. In this way, sub-threshold leakage current is significantly reduced. Note that with node 210 at voltage dV above $V_{SS}$, the gate-to-source voltage $V_{GS}$ for a nMOSFET within nMOS logic 208 having its source connected to node 210 is $V_{GS}=-dV$. Note also that as the node 210 charges, the reverse-bias increases.

However, if the input voltages at input port 206 are such that a nMOSFET stack within nMOS logic 208 is switched ON (a low impedance path is provided between node 210 and power rail 214), then nMOS logic 208 performs a fast pull-up operation on node 210 until it is pulled up to $V_{CC}$-$V_T$. Then, the single-ended sense amplifier comprising inverter 220 and pMOSFET 222 kicks in and continues to charge node 210 so that it is pulled HIGH (substantially to $V_{CC}$). In this way, a full-rail transition is provided. Because of this, and because node 210 is connected to sources of nMOSFETs in nMOS logic 208, the domino logic gate of FIG. 2 may be referred to as a full-swing, source-follower domino logic gate.

For some embodiments, nMOSFET 212 may not be sized sufficiently large enough completely discharge node 210 to LOW during a pre-charge phase, in which case the above description regarding the charging of node 210 by sub-threshold leakage current applies. In this case, node 210 may already be at the voltage dV, or perhaps less than dV. Consequently, those nMOSFETs within nMOS logic 208 with sources connected to node 210 may already be reverse-biased into their cutoff region, or perhaps close to their cutoff region.

The half-keeper comprising nMOSFET 218 and inverter 216 is sized to maintain node 210 at the small voltage dV above $V_{SS}$ if node 210 is not pulled to $V_{CC}$-$V_T$ by nMOS logic 208.

Figure 1:
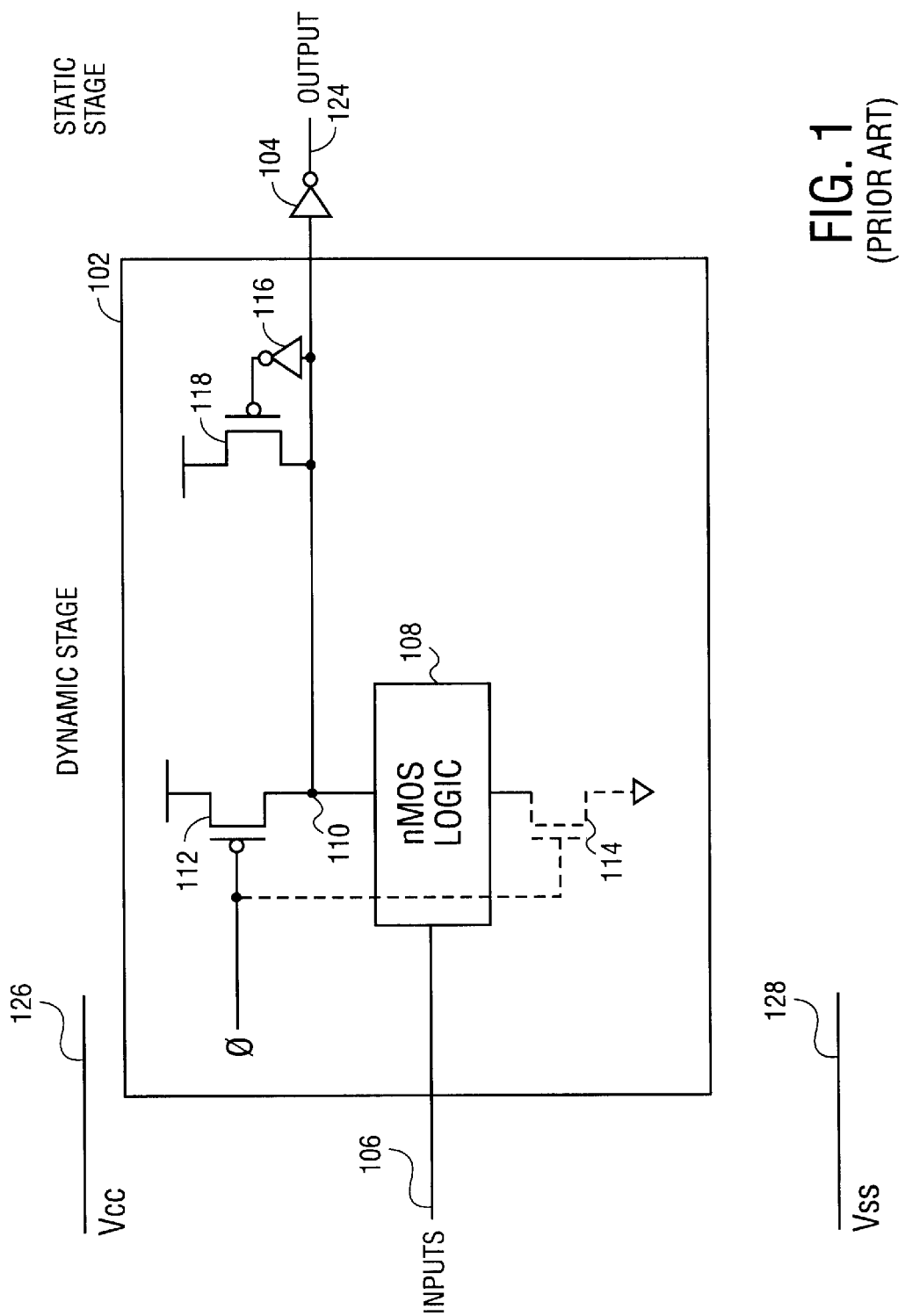
FIG. 1 is a prior art domino logic gate.

An advantage of the embodiment of FIG. 2 over that of FIG. 1 is that for process technologies in which sub-threshold leakage currents need to be considered, the half-keeper comprising nMOSFET 218 and inverter 216 may not need to be up-sized as aggressively because sub-threshold currents in nMOS logic 208 are suppressed by the reverse bias. As a result, performance may be maintained as process technology scales to smaller device sizes.

Figure 3B:
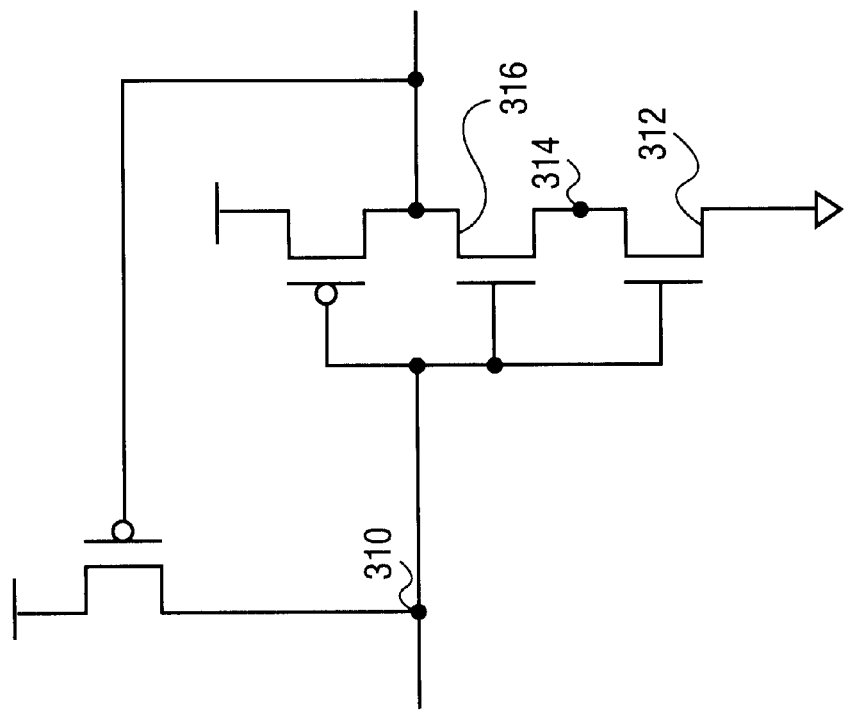
FIGS. 3A and 3B provide embodiments of a single-ended sense amplifier employed in the embodiment domino logic gate of FIG. 2.
Figure 3A:
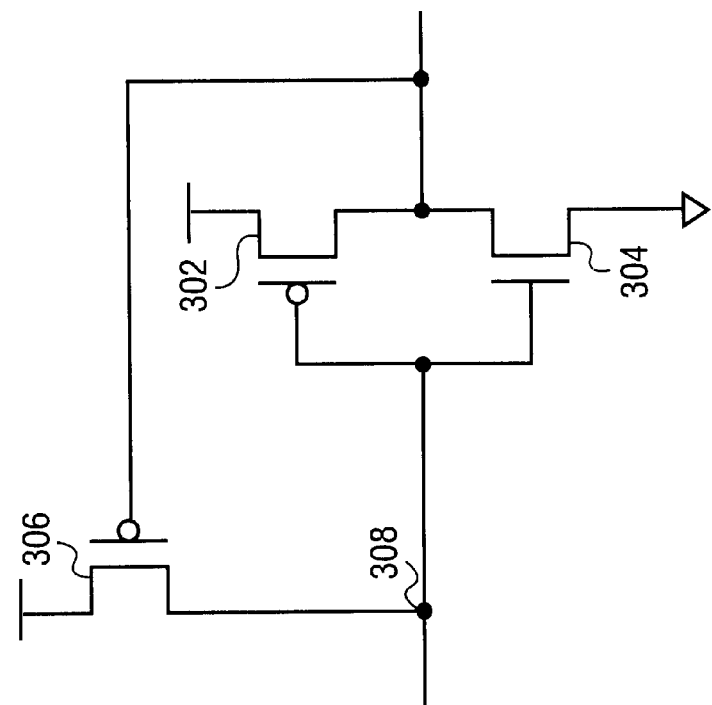

Different embodiments for the single-ended sense amplifier may be realized. Two embodiments are provided in FIGS. 3A and 3B. FIG. 3A is a straightforward implementation of an inverter, comprising pMOSFET 302 and nMOSFET 304, connected to pMOSFET 306. The embodiment of FIG. 3A may suffer from leakage current when node 308 is at the voltage dV above $V_{SS}$. Although nMOSFET 304 may not be turned ON strongly, the voltage dV+$V_{SS}$ at node 308 may be such that leakage current flows through nMOSFET 304, thereby wasting power. The embodiment of FIG. 3B may be considered a low-leakage single-ended sense amplifier. If node 310 is at the voltage dV+$V_{SS}$, then any leakage current through nMOSFET 312 will cause the voltage at node 314 to rise. The embodiment of FIG. 3B may be designed so that the voltage at node 314 rises to dV+$V_{SS}$, in which case the gate-to-source voltage of nMOSFET 316 is zero and nMOSFET 316 is turned OFF. In this way, leakage current is significantly reduced. In either embodiment, inverter 220 may be designed so as to be n-skewed.

What is claimed is:

1. A dynamic circuit having an evaluation phase and a pre-charge phase, the dynamic circuit comprising:
   a node;
   a pulldown nMOSFET to discharge the node during a pre-charge phase;
   a nMOSFET logic block to conditionally charge the node during an evaluation phase;
   a half-keeper to maintain the node in a discharged state during an evaluation phase if the node is not charged by the nMOSFET logic block;
   a first pMOSFET comprising a gate and a drain connected to the node; and
   an inverter comprising an input port connected to the node and an output port connected to the gate of the first pMOSFET.

2. The dynamic circuit as set forth in claim 1, wherein the inverter comprises:
   a second pMOSFET comprising a gate connected to the node and a drain connected to the gate of the first pMOSFET;
   a first nMOSFET comprising a gate connected to the node, a drain connected to the gate of the first pMOSFET, and a source; and
   a second nMOSFET comprising a gate connected to the node, and a drain connected to the source of the first nMOSFET.

3. A dynamic circuit having an evaluation phase and a pre-charge phase, the dynamic circuit comprising:
   a node;
   a pulldown nMOSFET comprising a drain connected to the node so that the pulldown nMOSFET is switched ON during a pre-charge phase and is switched OFF during an evaluation phase;
   a nMOSFET logic block connected to the node to conditionally charge the node, the nMOSFET logic block comprising at least one nMOSFET comprising a source connected to the node;
   a half-keeper comprising a half-keeper nMOSFET comprising a drain connected to the node;
   a first pMOSFET comprising a gate and a drain connected to the node; and
   an inverter comprising an input port connected to the node and an output port connected to the gate of the first pMOSFET.

4. The dynamic circuit as set forth in claim 3, wherein the inverter comprises:
   a second pMOSFET comprising a gate connected to the node and a drain connected to the gate of the first pMOSFET;
   a first nMOSFET comprising a gate connected to the node, a drain connected to the gate of the first pMOSFET, and a source; and
   a second nMOSFET comprising a gate connected to the node, and a drain connected to the source of the first nMOSFET.

* * * * *